United States Patent [19]

Mahony

[11] 4,209,717
[45] Jun. 24, 1980

[54] SAMPLE AND HOLD CIRCUIT

[75] Inventor: John E. Mahony, Sacramento, Calif.

[73] Assignee: Litton Industrial Products, Inc., Beverly Hills, Calif.

[21] Appl. No.: 848,989

[22] Filed: Nov. 7, 1977

[51] Int. Cl.² .............................................. G11C 27/02
[52] U.S. Cl. .................................... 307/353; 328/151; 328/162
[58] Field of Search ................ 307/353, 352; 328/151, 328/162, 165

[56] References Cited
PUBLICATIONS

A C. Hansen, "Burst Mode Sampling Amplifier" IBM Technical Disclosure Bulletin vol. 14, No. 7 Dec. 1971 pp. 2196–2197.
J. Delarve et al., "Control Circuit For Sample-And-Hold Devices" IBM Technical Disclosure Bulletin vol. 19 No. 11 Apr. 1977 pp. 4211–4212.

Primary Examiner—John Zazworsky
Attorney, Agent, or Firm—Robert A. Seldon

[57] ABSTRACT

A low drift sample and hold circuit is disclosed comprising a transconductance input buffer coupled at its output to a plurality of CMOS inverters through a respective plurality of CMOS switches. The appropriate switches are momentarily addressed by a micro-processor while applying a respective input value to the buffer. The buffer is de-activated prior to the opening of the switch to prevent errors between the sampled and held values.

6 Claims, 1 Drawing Figure

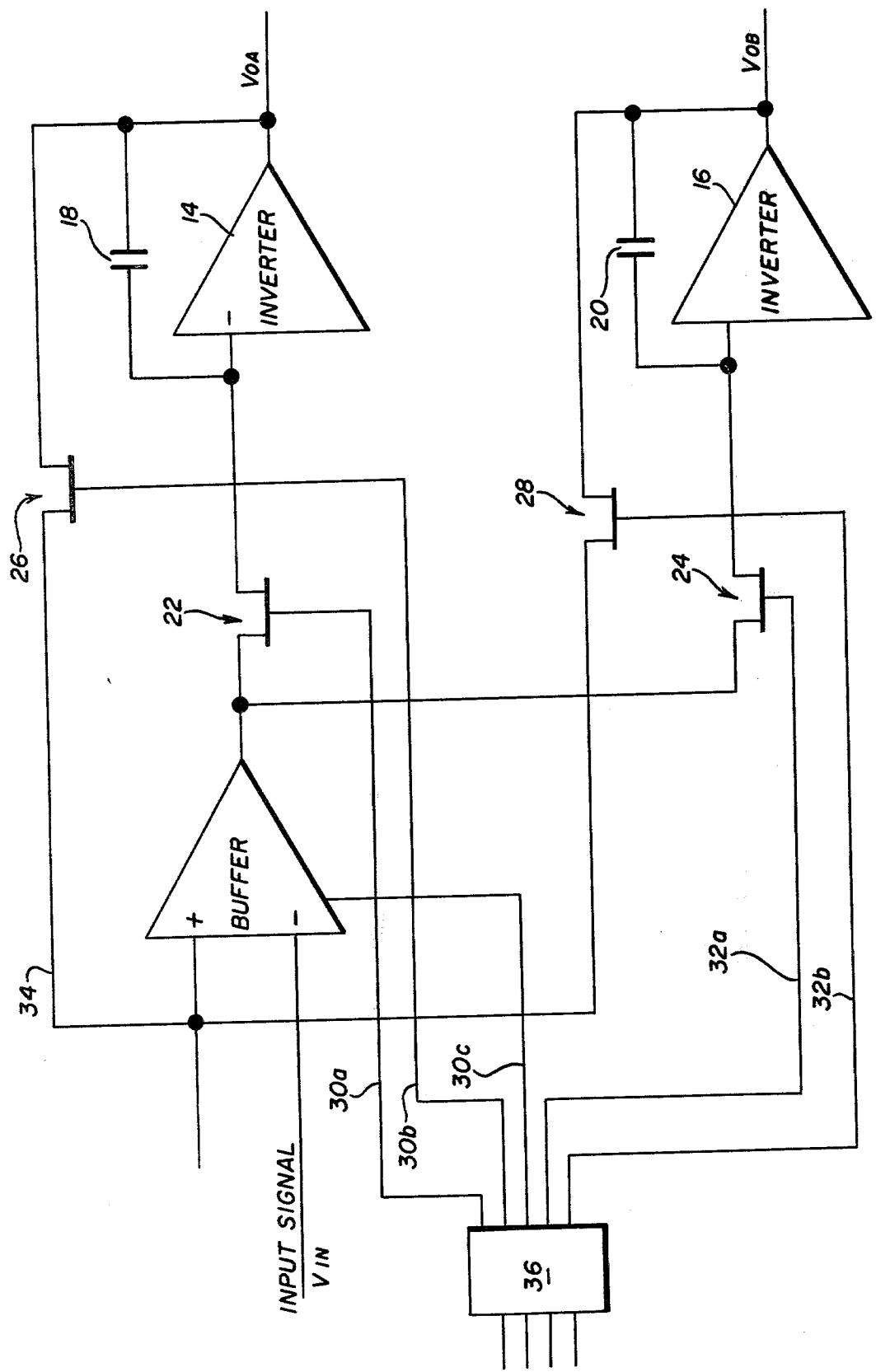

SAMPLE AND HOLD CIRCUIT

BACKGROUND OF THE INVENTION

This invention relates to sample-and-hold circuitry. Sample- and-hold circuits are generally known in the art and have found wide spread use in the analog conversion of digital output signals from a central processing unit. In such applications, the central processing unit momentarily places a digital signal on the input of a digital/analog converter and the momentary analog output signal therefrom is sampled in a timely manner and held by the sample-and-hold circuit as a voltage stored on a capacitor. The analog signal value is consequently available subsequent to the removal of the digital signal by the central processing unit. Typically, the held signal is cyclicly updated by the central processing unit.

SUMMARY OF THE PRIOR ART

Conventionally, a digital/analog converter is coupled to the output of a central processing unit (CPU), with a plurality of sample-and-hold circuits coupled in parallel to the converter output. Each of the sample-and-hold circuits may accordingly be timely enabled to receive and store a respective one of successively outputted signals from the CPU. Although it is desirable to minimize the amount of CPU time required for updating the sample-and-hold circuitry, the drifting of the held signal value from its sampled value has heretofore limited the allowable intervals. Drift is caused by leakage currents present at the input terminals of solid state amplifiers, through the storage capacitors, through switches and through the printed circuit boards.

The known use of larger capacitors to reduce leakage is undesirable for two reasons. First, the response time of the capacitor to changing signal levels is proportional to capacitance and it is obvious that the momentary nature of the applied input signal limits the maximum permissable response time. Secondly, the charging current required by capacitors is proportional to capacitance so that the currents available from integrated circuitry may be insufficient to charge capacitors of sufficiently large size.

In addition to drift errors, sample and hold circuits are susceptible to offset errors; that is to say, errors between the sampled value and held valve which are attributable to amplifier offset voltages. Offset errors have been heretofore minimized by the use of relatively expensive low-offset amplifiers having low input current requirements to meet leakage specs.

SUMMARY OF THE INVENTION

It is clearly an object of the invention to provide a sample-and-hold circuit having a minimal amount of drift.

It is another object of the invention to provide a low drift sample-and-hold circuit without the need for relatively expensive amplifiers.

A further aspect of the invention is to minimize errors between sampled input and held output signals due to voltage offset.

These and other objects of the invention are provided by a circuit comprising input buffer means having inverting and non- inverting input terminal means and arranged to receive an input signal at one of its inverting and non-inverting input terminal means, second buffer means characterized by a minimum input impedance in the order $10^{11}$ ohms, first switching means responsive to an enabling signal for coupling the input of the second buffer means to the output of the input buffer means, second switching means responsive to an enabling signal to couple the output of the second buffer means to the other of the non-inverting and inverting input terminal means, the input/output polarity relationship of the second buffer means being such that an input signal change produces a non-inverting change in the output signal of the second buffer means, and means for timely producing the enabling signals during application of the input signal to the input buffer means.

Further objects details of the invention are described in the following description of the Preferred Embodiment, of which the following FIGURE forms a part.

BRIEF DESCRIPTION OF THE DRAWING

The FIGURE is a schematic representation of a sample-and- hold circuit constructed in accordance with the invention.

DESCRIPTION OF THE PREFERRED EMBODIMENT

The FIGURE is a schematic representation of a sample-and- hold circuit constructed in accordance with the invention. A pair of inverting amplifiers 14, 16, are coupled in parallel through switch means 22 and 24, respectively, to the output of an input amplifier 12. Capacitors 18, 20 are respectively coupled to the amplifiers 14, 16 between the output and inverting input terminals thereof. The output terminals of the amplifiers 14, 16 are respectively coupled through switching means 26, 28 to the non-inverting input of the amplifier 12. An input signal, such as that from a digital/analog converter coupled to the output of a central processing unit, is coupled to the inverting input of the input amplifier 12.

It should be apparent to those skilled in the art that the amplifiers 14, 16 need not be inverting if the connections to the inverting and non-inverting inputs of amplifier 12 are interchanged and the capacitors 18, 20 are coupled to common rather than to the amplifier 14, 16 outputs. The inverting/non-inverting relationship of the amplifiers 14, 16 inputs and outputs are selected so that a change in input signal $V_{in}$ causes a non-inverted change in the feedback signal $V_{FB}$.

Referring only to the amplifiers 12 and 14 for the moment, it may be appreciated that the closing of the switches 22, 26 will cause the output signal $V_{OA}$ to change until it is essentially equivalent to the input signal $V_{in}$, with offset errors in the amplifier 14 being automatically compensated for. Because the gain of the circuit is provided by the input amplifier 12, the amplifier 14 may additionally be one of the low gain. Since the gain and offset errors of the amplifier 14 are not critical, the configuration conveniently lends itself to the use of CMOS inverters which are relatively inexpensive and require low input currents, but which are conventionally used as digital devices. In the preferred embodiment, RCA 4069's have been chosen as the inverting amplifiers while the switching means 22, 24, 26, 28 are provided by CMOS switches such as RCA 4016's.

The circuit illustrated in the FIGURE is adapted to sample-and-hold two values, although it may be appreciated that any number of values may be simultaneously held by means of additional inexpensive inverters and switching means, and without the necessity of low-offset additional amplifiers such as amplifier 12.

In operation, the appropriate "hold" portion of the circuit is enabled by, for example, a signal 30a, b which couples the amplifier 14 to the buffer 12 or, alternatively, by a signal 32a, b which causes the coupling of the inverter 16 to the buffer 12. In practice, the appropriate switches may be momentarily addressed by a CPU or microprocessor 36 while applying a respective input signal $V_{in}$ to the buffer 12.

Means may be provided to isolate the held value from the effects of non-simultaneous openings of the sample-and-hold switches. For example, the opening of switch 26 before switch 22 produces offsets. Such offsets occur because the prior openings of the switch means 26 provides a "0" signal at the non-inverting input terminal of the amplifier 12, which then compensates for the change in the feedback signal 34 by increasing its output. The held output voltage $V_{OA}$ is thereby increasingly offset from the value of the sampled voltage $V_{in}$ until the switch 22 opens.

Alternatively, the opening of switch 22 prior to switch 26 may permit the input buffer to saturate so that a "glitch" will occur when the next stored value is updated.

Means for preventing such occurrences is provided in the preferred embodiment by a timing circuit 36 which is responsive to a trigger signal to deactivate the input buffer 12 prior to the opening of the sample-and-hold switches. The input buffer 12 is a transconductance amplifier such as an RCA 3080; the input signal is a voltage level and the buffer output signal is a current level. The inverting amplifiers 14, 16 are current responsive. When the input amplifier 12 is de-energized, no output current flows therefrom and the held voltages $V_{OA}$, $V_{OB}$ consequently remains fixed. Thus, the opening of the switch 28 before the switch 24 or similarly, the switch 26 before the switch 22, will not effect the held signal value.

I claim:
1. A low drift sample-and-hold circuit comprising:
  input buffer means having inverting and non-inverting inut terminal means, and arranged to receive an input signal at one of its inverting and non-inverting input terminal means;
  second buffer means characterized by a minimum input impedance in the order of $10^{11}$ ohms;
  first switching means responsive to a first enabling signal for coupling the input of the second buffer means to the output of the input buffer means;
  second switching means responsive to a second enabling signal to couple the output of the second buffer means to the other of the non-inverting and inverting input terminal means,
  the input/output polarity relationship of the second buffer means being such that an input signal change produces a non-inverting change in the output signal of the second buffer means; and
  means for simultaneously producing the enabling signals during application of the input signal to the input buffer means.

2. The circuit of claim 1 wherein the second buffer means is a digital inverter.

3. The circuit of claim 2 wherein the second buffer means is a CMOS inverter.

4. The circuit of claim 1 wherein the first and second switching means includes CMOS switching devices.

5. The circuit of claim 1 further including means responsive to a trigger signal to energize the input buffer means and to produce the enabling signals, thereby permitting the samples of the input signal and operable to de-active the input buffer means prior to decoupling by the first and second switching means.

6. The circuit of claim 3 wherein the input buffer means includes a transconductance amplifier.

* * * * *